United States Patent [19]

Noto

[11] Patent Number: 4,580,228

[45] Date of Patent: Apr. 1, 1986

[54] AUTOMATED DESIGN PROGRAM FOR LSI AND VLSI CIRCUITS

[75] Inventor: Richard Noto, Maple Shade, N.J.

[73] Assignee: The United States of America as represented by the Secretary of the Army, Washington, D.C.

[21] Appl. No.: 501,687

[22] Filed: Jun. 6, 1983

[51] Int. Cl.⁴ ............................................. G06F 15/60
[52] U.S. Cl. ..................................... 364/491; 364/300
[58] Field of Search ............... 364/488, 489, 490, 491, 364/300

[56] References Cited

U.S. PATENT DOCUMENTS

| | | | |
|---|---|---|---|
| 3,622,762 | 11/1971 | Dyer et al. | 364/489 |
| 3,968,478 | 7/1976 | Mensch, Jr. | 364/491 |
| 4,377,849 | 3/1983 | Finger et al. | 364/491 |
| 4,386,403 | 5/1983 | Hsieh et al. | 364/300 |
| 4,441,207 | 4/1984 | Lougheed et al. | 364/490 |
| 4,484,292 | 11/1984 | Hong et al. | 364/491 |
| 4,500,963 | 2/1985 | Smith et al. | 364/488 |

OTHER PUBLICATIONS

Trimberge, *Automating Chip Layout;* Spectrum, vol. 19, No. 6, Jun. 1982.

Primary Examiner—Felix D. Gruber
Attorney, Agent, or Firm—Anthony T. Lane; Jeremiah G. Murray; John T. Rehberg

[57] ABSTRACT

A computer process for the automatic layout of a multiport, two-dimensional microcircuit. The program provides for improved cell placement and power distribution while minimizing the overall chip area dimensions. The power distribution layout provides for the supply of power to cell rows which is independent of the peripheral power routes.

6 Claims, 5 Drawing Figures

AUTOMATED DESIGN PROGRAM FOR LSI AND VLSI CIRCUITS

STATEMENT OF GOVERNMENT INTEREST

The Government has rights in this invention pursuant to Contract No. DAAK20-81-C-0402 awarded by the Department of the Army.

BACKGROUND OF THE INVENTION

This invention relates to computer-aided design (CAD) techniques to generate custom LSI and VLSI devices.

The development and increased application of LSI and VLSI devices has resulted in considerable activity in the area relating to the effective and economical design of such circuits. One of the principal fields in which this activity has focused is in the development of CAD techniques to reduce the cost and design time of complex and sophisticated custom LSI and VLSI devices using various technologies.

While many computer-aided solutions to these design problems have been offered, these methods have generally failed to meet the demands imposed by improved manufacturing capabilities which permit smaller and more dense circuit layouts. As the logic layout becomes increasingly complex, new solutions must be provided in order to maintain the cost and design effectiveness of computer-aided approaches.

SUMMARY OF THE INVENTION

The object of this invention is to provide an automated layout system for VLSI devices which will generate a custom network layout in a minimum area in an acceptable turnaround time.

The method according to the invention provides a minimum area network layout from a user-specified list of logic cells and cell interconnections. This procedure may be used in conjunction with standard cell techniques to produce low-cost, custom devices.

The method comprises essentially four separate phases of operation: input, placement, routing and output. In the input phase, all design contraints are supplied by the user. It is only during this phase that the logic designer is required to interact with the program.

The placement phase seeks to reduce the chip area requirements by varying the placement distribution of the individual logic cells in such a way that density is increased while routing connections are minimized. This is accomplished by sequentially improving the y-span and x-span route distance and reducing the number of skipped cell rows using the cell pair interchange technique for the elements on the chip placement surface.

The routing phase breaks the list of logic interconnection nodes into routable node segments—for example, node segments which connect cells within a cell row, and node segments which connect cells between two adjacent cell rows. The logic routes are established in the order of center routing, side and interior subchip routing, and post routing.

The last phase, output, performs an analysis of the final routing layout and establishes routes from the chip interior power distribution to the peripheral power bus. These buses may be treated as either metal signal lines just as any ordinary signal line, or as actual power bus lines having the width of the power bus to permit improved power distribution. The information is then converted into an artwork language supplying all necessary data for fabricating the device.

DETAILED DESCRIPTION OF THE INVENTION

Figure 1:
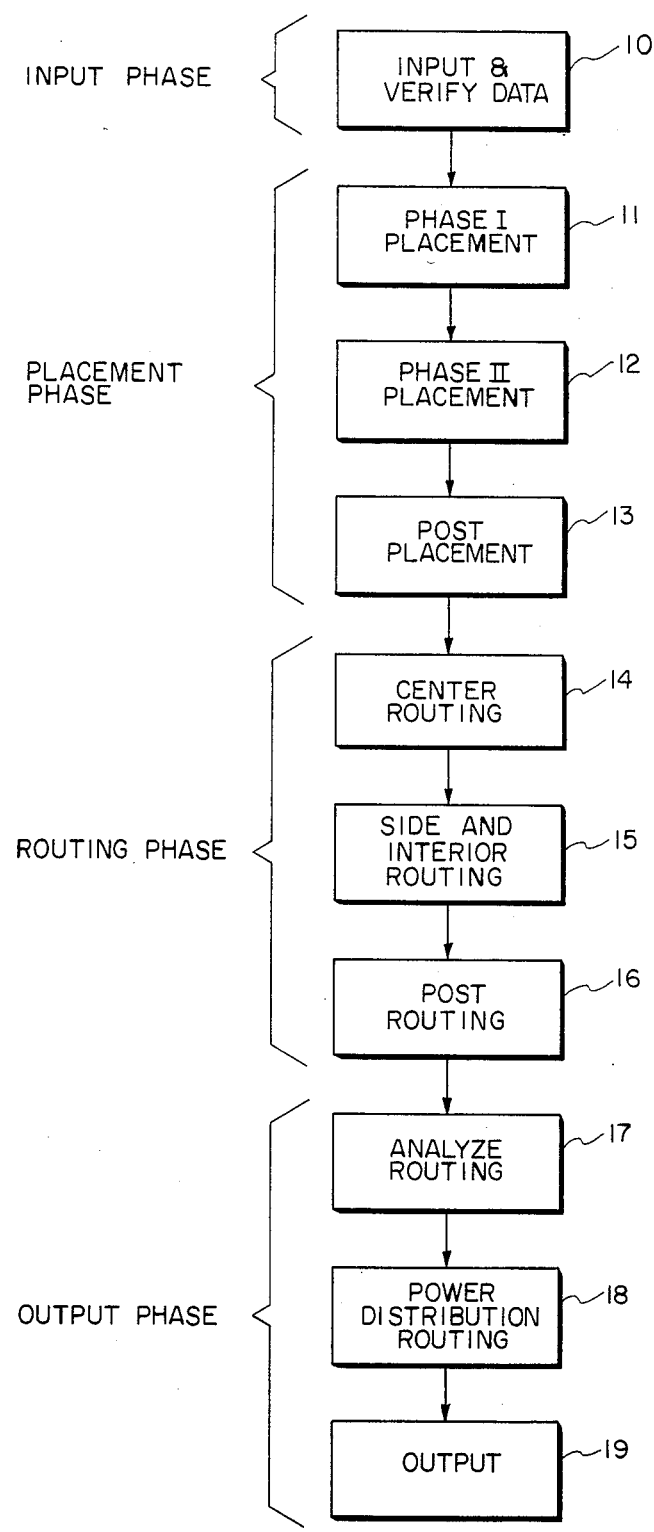
FIG. 1 is a system flowchart.

The multiport two-dimensional automated layout program (MP2D) is a computer-aided design system (CAD) which implements design-automation techniques for the efficient and economical layout of LSI and VLSI circuits. As shown in FIG. 1, the system operates in four separate phases—input, placement, routing and output—and generates a design for ultimate fabrication of a circuit.

Large-scale integrated circuits are typically made up of a substrate upon which are placed a network of logic cells and subchips. A logic cell is generally considered to be a standard unit while a subchip is a user designed multiple of logic units. With the various components being adapted to be interconnected by metal and polysilicon routes on the substrate, the overall circuit is particularly adaptable for automated layout techniques.

Figure 2:
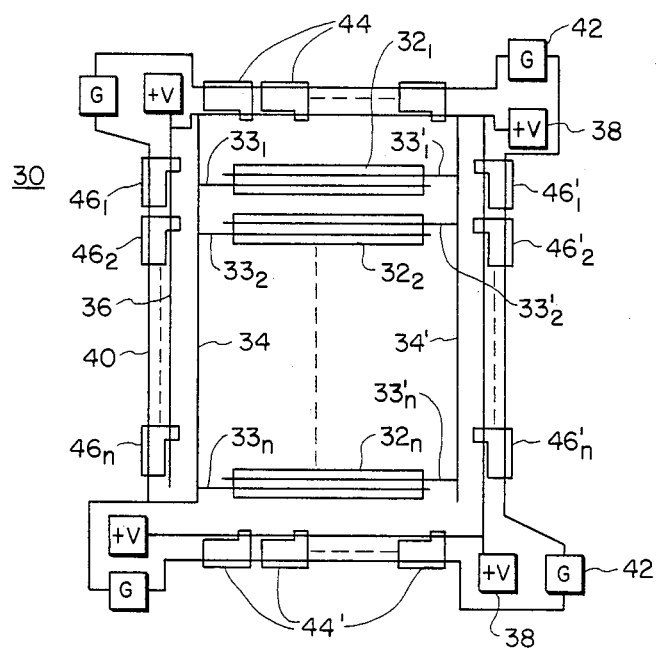
FIG. 2 is a plan view of a circuit constructed in accordance with the invention.

Referring to FIG. 2, there is shown a generalized layout of the primary components of a typical circuit produced in accordance with the invention. Circuit 30, in its basic form, comprises a plurality of internal cell rows $32_1$-$32_n$ which are coupled to a peripheral power bus by way of internal buses 34 and 34'. A bordering configuration of peripheral bonding pads 44 and 44' at the top and bottom and 46 and 46' at the sides are selectively coupled to the internal cell rows 32 for input and output. The peripheral power bus is a "double-box" configuration comprising lines 36 and 40 which interconnect a plurality of double power pads 38 and 42, respectively, on each corner of circuit 30.

Power Distribution

The use of the double box configuration of the power bus is especially significant due to the fact that as the interior logic cell content of chips increases with improved technology, power distribution becomes an ever increasing problem. Earlier designs which utilized only a single pair of power pads and an interleaved box power bus, required that I/O bonding pads occur in associate or sister pairs in order to insure the proper voltage-to-ground relationship at any point in the circuit. In the circuit shown in FIG. 2, since the peripheral power distribution is the same on all four edges of the chip, bonding pads are not required to have associated sister pads. Further, due to the fact that the internal power buses 34 and 34' are directly tied to a power pad, the power supply to the cell rows will be independent of the peripheral power distribution. This is important since the bonding pads may, and often do, require significant current. Thus, in the present configuration the cell row power supply will not be degraded by the bonding pad current requirements.

The use of the double-box configuration, however, does affect the routing connections from the internal cells 32 to side bonding pads 46 and 46' due to the fact that the internal power buses $33_1$ to $33_n$ and $33_1'$ to $33_n'$ may prevent a direct pad-to-cell connection. This problem and its solution are illustrated in greater detail with reference to FIGS. 3 and 4.

Figure 3:
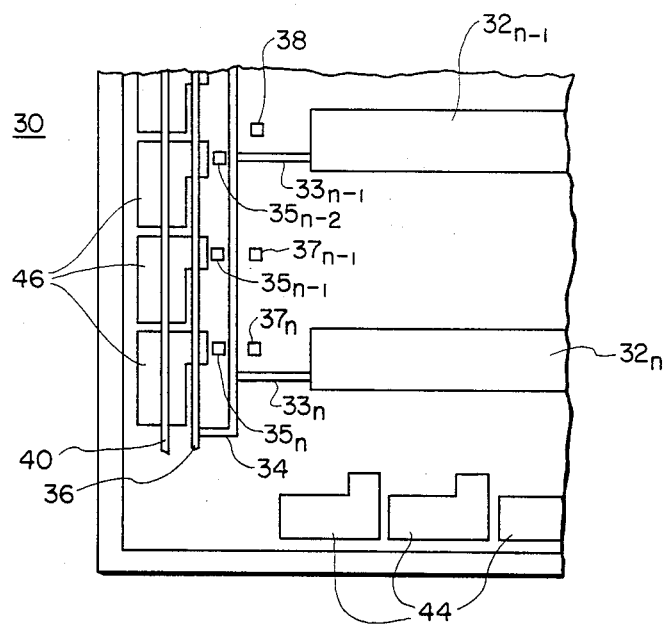
FIG. 3 is a detail view of one section of the circuit of FIG. 2 showing the power bus connections.

FIG. 3 shows a section of typical power bus connection route from the logic cells to the power bus. Bonding pads 46 are linked to signal routes by way of pins 35, 37 and 38. The peripheral power bus line 34 connects to the internal logic cell rows 32. The typical arrangement for signal route-to-bonding pad connection is shown by pins 35 and 37 where a direct connection may be made under bus 34. The fact that a direct connection may be made allows routing to proceed directly to pins 35 and 37. However, in the case of pins 38 and 35, a direct route is not available due to the interference of the signal line $33_n$.

Figure 4:
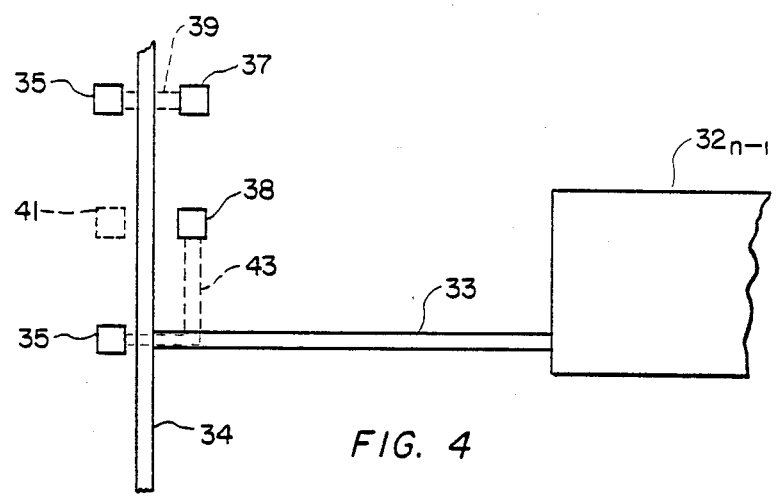
FIG. 4 is a schematic illustrating the placement of phantom pins.

As shown in greater detail in FIG. 4, when power bus routing interferes with the link of bonding pad pins 38 and 35, a phantom pin 41 is generated so that routing to those pins may be generated. In the output phase, a special route 43 will be generated from the true pin 38 to the actual pin 35.

Internal Logic Cells

Referring again to FIG. 2, the interior area of the circuit comprises the functional logic units of the device as shown by internal cell rows 32. There are actually two related logic elements which maybe specified: the unit, or standard cell and the subchip. The standard cell is generally a combinatorial NAND/NOR logic cell of one cell row in height and one or more cell units in width. The standard cells comprise a family of user-designed circuits and having I/O pins on the upper and lower edges to be used as basic building blocks for more complex functions. The subchip, on the other hand, is a non-standard, four-sided cell. These high-density handcrafted logic cells are typically very wide as compared to standard cells and cover at least three cell rows from top to bottom. Active input/output pins on subchips are associated with one or more standard cells and are located on the top and bottom edges and, optionally, on both side edges.

The logic network design of the circuit is specified by the user as element/pattern data which specifies the topology of each of the cells, and node data which provides the network interconnection between cells. From these files, the placement and routing algorithms seek to optimize the overall chip design by adjusting cell placement and minimizing routing.

Input Data Description

Element/Pattern data: The element/pattern data relates each logic element in the circuit to a specific pattern of logic gates such as those provided in the user's standard cell library. In addition, this file may optionally contain the fixed placement data for elements with respect to the chip surface.

Node data: The node list specifies the logical interconnection of the elements and pins on the chip.

Critical Path data: The optional critical path data allows the user to specify particular routes within the circuit in order to provide for program controlled placement and routing of specified logic paths such that path delays for these critical elements are minimized.

PROGRAM OPERATION

The system flowchart of FIG. 1 provides a general description of program operations. For clarity purposes, the system operation has been divided into four separate phases: input, placement, routing and output.

INPUT

Referring to FIG. 1, the design data is specified by the user for input and verification by procedure 10. Using the input parameters set forth in the foregoing section, the basic structure of the circuit is defined in terms of element placement and logic interconnection.

PLACEMENT

The primary objective of the placement function is the minimization of the chip area required to produce the completed circuit. As shown in FIG. 1, the placement function consists of three separate procedures: Phase I Placement, 11, Phase II Placement 12, and Post-Placement 13. Prior to the beginning of the first phase, a pre-placement routine serves to initialize the variables set by the user input.

A. Placement Functions

1. Pre-Placement routine: Following input, the pre-placement function performs the indicated operations:
   -Set parameters and constants.
   -Divide large cells into associated unit area cells.
   -Generate initial placement surface and cell pair interchange map.
   -Place elements on cell placement surface.
   -Construct connectivity data list.

2. Cell Pair Interchange: Each of the placement procedures uses a technique known as cell pair interchange in order to determine the best placement of cells. After each element has been placed upon the placement surface and assigned an x-y grid location, the interchange routine examines the placement grid for valid element positions. Valid positions are defined as those grid points at which an element (cell or bonding pad) is allowed. Selecting a single valid position which may or may not contain an element "A", a boundary limit on interchange is calculated from user-specified parameters. Within this interchange boundary tho procedure locates an interchange candidate (which may or may not contain an element "B") at one of the possible interchange positions under the constraint that cells are allowed to interchange only with cells and bonding pads only with bonding pads. Further, elements fixed to rows may interchange only within that row, and elements fixed to a given location may not be interchanged. A trial interchange is then attempted. Distances for routing of these elements in their new locations are calculated by examining all necessary connections to the element, comparing these to the distances at the original grid positions, and testing the placement criteria to determine if the interchange will improve the placement.

B. Placement Procedures

1. Phase I Placement

Figure 5:
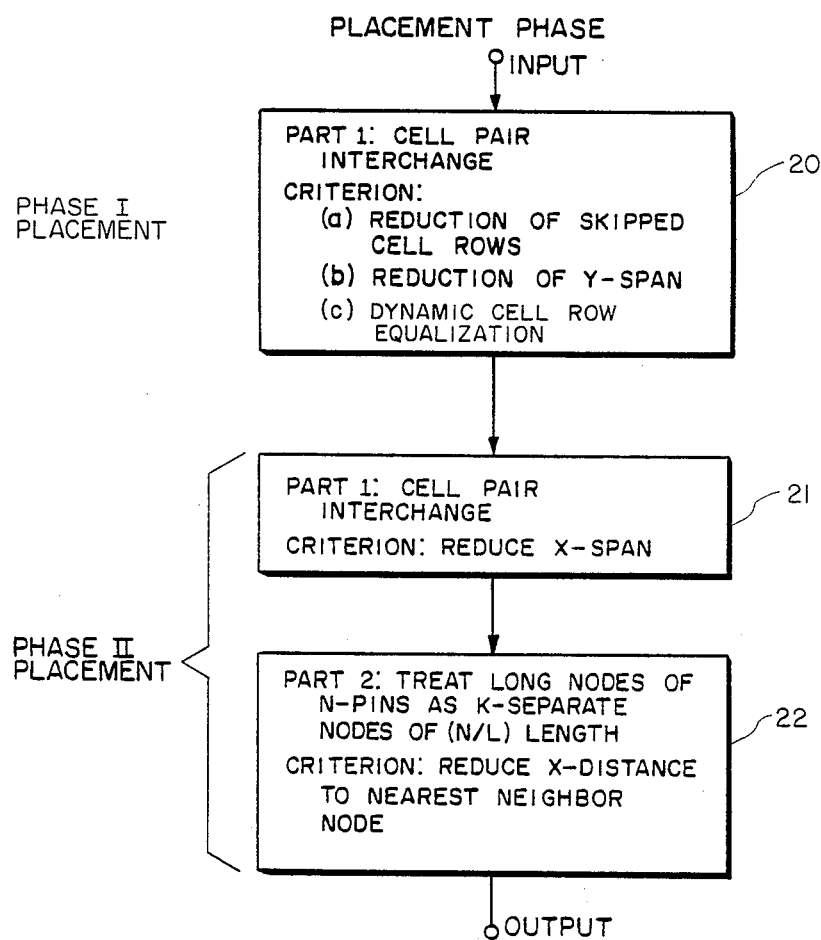
FIG. 5 is a detailed flowchart of the placement phase.

The objectives of the Phase I procedures are to generate a placement of all cells into cell rows and all bonding pads onto bonding pad rows and to minimize the maximum cell row width. Referring to FIG. 5, the placement procedure of Phase I is shown in greater detail.

In FIG. 5, procedure 20 uses multiple criteria to locate each cell or bonding pad into its best row by reducing the y-span, or routing distance for connections in the y-direction between cells and reducing the number of skipped cell rows thereby the number of routing feedthrus required to complete connectivity. Feedthrus are needed when logic connectivity must pass through a cell row but has no other connectivity on that cell row. Reduction of feedthru requirements has a direct effect on chip width as a large number of feedthrus implies less content within all cell rows. This also implies that the active logic elements are more closely located and, thereby, routing requirements are reduced together with reduced chip area.

The procedure also seeks to reduce or maintain the maximum cell row width. The limit on cell width, however is a soft limit in that a temporary increase in the maximum cell row width is permitted in order to provide for improved mobility of cells into other cell rows. This soft limit acts as a tolerance on maximum cell row width such that the tolerance gradually reduces to zero as the procedure progresses.

The procedure further provides for "dynamic cell row equalization." For each pass of the placement algorithm, with the exception of the final few, the cell row equalization procedure moves cells from "long" cell rows to "short" cell rows. While this acts to reduce the width of the maximum cell row, it also partially destroys the results of the previous pass of the pair interchange routine. This trade-off proceeds such that the next pass of the Phase I placement algorithm restores and further improves placement but permits the maximum cell row width to increase only be a new released tolerance value. In the final passes of the algorithm, cell row-equalization is not permitted.

The method uses a cell pair interchange based upon the following criteria:

(1) improvement of y-span distance calculations for the net improvement of both interchange candidate elements in the new locations as compared to the old.

(2) reduction of the number of skipped rows between cells based on improved distance calculation for the net improvement of both elements in their new locations.

(3) reduce or maintain maximum cell row width.

If either candidate interchange element tends to increase the maximum cell row width beyond the allowed tolerance, the proposed interchange is immediately rejected. Also, if the feedthru requirements for the candidate elements have changed such that the new width of the cell rows would exceed the maximum plus tolerance, that interchange is also rejected.

2. Phase II Placement

The fundamental objective of the Phase II placement procedure is to find the best location for each cell within each cell row and for each bonding pad within each bonding pad row as determined by Phase I placement. The emphasis is placed on x-span minimization in order to reduce chip area.

Part 1

The procedure 21 uses cell pair interchange to minimize the x-span of each node. This will, in effect, reduce the x-route distance between elements. The span is defined as the x-grid distance within which all cells of a node are contained on the placement surface.

Part 2

The objective of routine 22 is to adjust the x-location of the elements on the placement surface such that the x-distance of each element of each node is as close as possible to its nearest neighbor. The distance is defined as the nearest distance to other elements of the node, when the other element is within one cell row.

A variation of this procedure is used in the case of long nodes or nodes above a specified length. That is, a long node of N pins is treated as a continuous, connected ordered set of K equivalent nodes. Each of the K equivalent nodes is approximately (N/L) in length where L is a fixed constant (typically 10 to 15).

3. Post-Placement

Referring again to FIG. 1, the post-placement procedure 13 attempts to make a fine adjustment of bonding pad locations. This is done by relocating each bonding pad (not fixed by the user) as closely as possible to one of its logic-connected cells. The calculation for the fine adjustment of the pads is based on the overall best distance of each pad from its associated element with the distance being defined as the difference between the approxmate x-y centers of each cell and each bonding pad.

ROUTING

After the placement of all logic cells has been established, the routing phase generates the logic interconnection network as specified by the input data.

A. Routing Functions

There are two main procedures in the routing functions: smashing and direct routing.

1. Smashing

Using a technique known as smashing, each node is broken down into routable segments for establishing signal routes. The routable segments identify all cell connections within a cell row as a single segment and all connections between cell rows, all two pins, as a single segment so that each segment can be direct-routed by a simple routing algorithm. Likewise, all connections to the side pads of the array are two-node segments of one pin each for routing within the center routing surface and the side routing surface. Thus, the entire logic network as defined on input is reduced to a list of routable node segment connections.

2. Direct Routing

Direct routing establishes the logic signal routes according to any of the standard procedures well known in the art. The post routing algorithms minimize the length of the polysilicon portions of the routing and reduce the area requirements.

B. Routing Phases

Referring again to FIG. 1, the routing phase proceeds in the order of center routing 14, side and interior routing 15, and post routing 16.

The center routing is performed first due to the fact that prior to the routing phase the relative coordinates of each element (not within a cell row) are unknown. This is particularly true in regard to the relative positioning of cell rows with respect to the side bonding pads. By routing the center first, the relative y-coordinate locations of each of the cells within cell rows can be determined. Then, using the center of the center routing as a reference and the center of the side pads as that same reference, the relative y-locations of all elements may be defined.

Proceeding to side routing and using the x-center of the center surface as a reference, the starting x-location of both of the side rows may be defined. Thus, when side routing is completed, all relative x- and y-coordinate locations are known. Interior routing of subchips is also performed in this procedure.

A primary concern in routing is the power bus distribution to the cell rows. There are two options available for routing these bus lines. On one hand, the metal lines may be specified as having the same width as an ordinary signal line and routed as such. Alternatively, the cell row power bus may be set to the width of the power line in order to improve power distribution. As these metal power buses may interfere with the input-/output pins of the side bonding pads, phantom pin locations are used. As discussed previously in reference to FIG. 4, when power bus 34 routing interferes with bonding pad pins 35 and 38, a phantom pin 41 is generated so that routing to those pins can be completed. In the output phase, in addition to the routings to the phantom pin, special routing 43 from the phantom pin location to the true pin location is also generated.

OUTPUT

As shown in FIG. 1, the output phase begins by analyzing the routing produced by the previous phase and generating the phantom pin connections with the analysis procedure 17. Then procedure 18 generates output data specifying the appropriate metalization for power bus lines. Finally, procedure 19 translates all other data for placement and routing into an artwork language for the ultimate fabrication of the chip.

While the invention has been described in connection with specific illustrative embodiments, obvious variations will occur to those skilled in the art. Accordingly, the invention should be limited only by the scope of the appended claims.

What is claimed is:

1. A computer process for the automatic layout of multiport, two-dimensional microcircuits comprising the steps of:
   (a) defining a general microcircuit layout including an x-y orthogonal grid, logic cell geometry and relative cell placement, and node interconnections of logic cells;
   (b) generating an initial placement surface of logic cell rows by establishing cell placements on said orthogonal grid;
   (c) exchanging cell pair locations according to multiple criteria in order to optimize initial cell placement;
   (d) exchanging node-connected cell pairs along cell rows to thereby reduce the distance to the nearest connected cells;
   (e) establishing routing for pin-to-pin connections;
   (f) establishing subchip interior routing;
   (g) establishing routing from cell rows to peripheral power connectors;
   (h) analyzing routing output for translation to a computer graphics language which is suitable for describing the fabrication layout of the circuit module;
   (i) creating power bus routes;
   (j) translating placement and connection data into said computer graphics language.

2. A computer process as set forth in claim 1 wherein said multiple criteria for optimizing the initial cell placement is characterized by the following:
   (a) reduce the number of skipped cell rows;
   (b) reduce y-span between interconnected cells; and
   (c) permit a temporary increase in the length of the longest cell rows.

3. A computer process as set forth in claim 1 wherein said movement of node-connected cell pairs as called for in step (d) is accomplished by treating long nodes of N pins as K separate nodes of approximate length (N/L) where L is a user-specified value.

4. A computer process as set forth in claim 1 wherein said power buses are routed such that the spatial voltage bus-to-ground bus relationship is the same along all peripheral edges of the microcircuit.

5. A computer process as set forth in claim 1 wherein said power buses are routed such that power routing to cells is independent of peripheral power routing.

6. A computer process as set forth in claim 5 wherein the procedure for establishing peripheral power routing includes the generating of phantom connector pins and the generating of additional routing from a true pin to said phantom pin.

* * * * *